United States Patent [19]
Glasser

[11] Patent Number: 5,142,540
[45] Date of Patent: Aug. 25, 1992

[54] MULTIPART MEMORY APPARATUS WITH ERROR DETECTION

[76] Inventor: Lance A. Glasser, 14913 Dufief Dr., North Potomac, Md. 20878-2518

[21] Appl. No.: 492,633

[22] Filed: Mar. 13, 1990

[51] Int. Cl.⁵ .................. G06F 11/10; G11C 8/00
[52] U.S. Cl. ..................... 371/40.1; 365/189.04; 365/230.05; 371/2.2
[58] Field of Search ............... 371/40.1, 2.2; 365/189.04, 230.05

[56] References Cited

U.S. PATENT DOCUMENTS

| | | | |
|---|---|---|---|
| 4,125,877 | 11/1978 | Reinert | 365/190 |
| 4,287,575 | 9/1981 | Eardley et al. | 365/174 |
| 4,500,956 | 2/1985 | Leiainger | 364/200 |
| 4,541,076 | 9/1985 | Bowers et al. | 365/190 |
| 4,578,780 | 3/1986 | Baba | 365/190 |
| 4,616,347 | 10/1986 | Bernstein | 365/230.05 |
| 4,623,990 | 11/1986 | Allen et al. | 365/189 |
| 4,719,601 | 1/1988 | Gray et al. | 365/210 |
| 4,815,038 | 3/1989 | Scharrer et al. | 365/189 |
| 4,817,051 | 3/1989 | Chang | 365/154 |
| 4,833,649 | 5/1989 | Greub | 365/189.06 |
| 4,884,243 | 11/1989 | Bergmen et al. | 365/189 |
| 4,891,794 | 1/1990 | Hush et al. | 365/189.04 |
| 4,893,280 | 1/1990 | Pasqualino et al. | 365/189 |
| 4,918,664 | 4/1990 | Platt | 365/189 |
| 4,937,781 | 6/1990 | Lee et al. | 364/900 |
| 5,001,671 | 3/1991 | Koo et al. | 365/230.05 |
| 5,036,491 | 7/1991 | Yamaguchi | 365/189.07 |

*Primary Examiner*—Charles E. Atkinson
*Attorney, Agent, or Firm*—Thomas J. Engellenner

[57] ABSTRACT

A memory apparatus for storage and retrieval of digital data is disclosed, including a controller and a memory element having an array of memory cells, each cell having fewer ports than are provided by the memory system. The memory cells are adapted for storing digital data words, each word being a set of bits or symbols. The memory array is partitioned into a plurality of bins for storing words, the individual bits of each word being distributed in a selected addressing sequence among a plurality of selected bins in the memory array, such that bin reading conflicts generate a number of errors less than or equal to a numerical error limit K, where K is less than the number of bits in a word. The data words can be manipulated so as to produce error-free results.

11 Claims, 3 Drawing Sheets

MULTIPART MEMORY APPARATUS WITH ERROR DETECTION

BACKGROUND OF THE INVENTION

This invention relates generally to memory systems for storage and retrieval of digital data, and, more particularly, relates to apparatus and methods for providing high-speed, multi-port Random Access Memory (RAM) and Read-Only Memory (ROM).

Multi-port RAM and ROM devices are widely utilized in digital computers and communications systems. These multi-port devices are intended to reduce data access time by providing several simultaneous paths to the data. In conventional multi-port RAM, for example, the data path includes a decoder that translates an externally supplied memory address into a set of internal signals. These internal signals activate selected internal memory cells corresponding to the external address. The external address may be, for example, an n-bit binary number that is decoded into one of $2^n$ internal addresses. Multi-port RAM devices also utilize a data path in which a selected plurality of activated memory cells are connected to the data ports in response to the externally supplied address. The data paths enable several RAM ports to read and write data.

In the simplest multi-port configuration, the entire decoder/selector path is duplicated for each port. The ports can be used to READ or WRITE data without interacting, unless they address the same memory cells. Path-independence permits external devices connected to the various ports to share data conveniently, with low latency and high bandwidth.

Multi-port memory devices of this type, however, have significant limitations. In particular, the necessary duplication of nearly the entire memory system—except for the shared multi-port memory cells—multiplies the cost and complexity of the device. In addition to duplication of the memory system, the multi-port memory cell itself must have more wires and ports than its single-port counterpart. Multi-port RAM of this configuration thus occupies significantly more area than does single-port RAM, further increasing the cost and size of integrated circuit implementations.

Additionally, because a multi-port RAM of conventional design is larger, its internal wires must be longer. These wires therefore have higher capacitance, which reduces speed. Multi-port RAMs, as a result, tend to be slower than single-port RAMs of the same number of bits.

In an attempt to avoid the area-related costs entailed by multiple-pathway multi-port RAM, a second class of multi-port AM utilizes memory cells having fewer ports and reduced wiring area. However, in these devices, the narrow data path cannot support completely independent access from the ports to the memory cells. Occasionally, several ports will try to simultaneously use a part of the data path that is too narrow to support all of the requests. When two ports address neighboring data words, for example, each port's request cannot be simultaneously serviced, and a "conflict" arises. Such conflicts can be resolved by controlling the ports to access neighboring data words at different times—i.e., time-domain multiplexing. This multiplexing, however, imposes a time and speed penalty.

Conventional time-domain multiplexing techniques can be divided into two classes: deterministic and stochastic. In deterministic systems, the speed penalty associated with time-domain multiplexing is incurred on every data access operation. Stochastic approaches involve a degree of randomness that permits the time penalty to be avoided on some, but not all, data accesses.

In multi-port RAM devices utilizing deterministic time-domain multiplexing, the memory system can utilize a RAM cell having fewer ports than the overall memory system. A dual-port RAM system, for example, can utilize single-port memory cells.

Although the deterministic configuration requires less wire and area, the path to the data is narrower, and has reduced bandwidth, compared to a single-port RAM. Thus, the deterministic memory system is slower overall than is a single-port RAM. For example, a known technique for constructing a dual-port RAM from single-port cells involves time-sharing the access path so that the ports alternate accesses. First one port gains exclusive access to the decoder and memory cells; then, the second port is permitted to use these resources; then the access cycle repeats. The overall speed of the dual-port RAM is therefore approximately half that of the single-port RAM.

In conventional multi-port RAM system utilizing stochastic time-domain multiplexing, wiring and area requirements are reduced by providing a narrower path to the memory cells. This narrow path is usually insufficient to support the most general form of multi-port access, so the memory system is divided into subsystems—referred to as "bins"—and part of the decoder path is duplicated. In a dual-port RAM having stochastic time-domain multiplexing, when Port A is requested to access data in one bin and Port B is requested to access data in a different bin, both ports can service these requests simultaneously, because separate paths exist between the bins and the ports.

However, if both ports attempt to access a memory location in the same bin, a conflict arises. Because only a portion of the data path between ports and memory cells is duplicated—i.e., the section from the ports to the bins—the ports occasionally attempt to use the same resources for different purposes. Both ports cannot obtain correct data if a conflict arises. Thus, conventional practice requires that at least one port wait when a conflict occurs. This additional delay, experienced by at least one of the ports during a conflict, further reduces average system speed, and the non-deterministic nature of the delay increases the complexity of the system containing the multi-port RAM.

It is accordingly an object of the invention to provide improved multi-port memory devices having enhanced operational speed.

Another object of the invention is to provide multi-port memory apparatus requiring less cell and wiring area than that of conventional multi-port memory devices.

A further object of the invention is to provide a memory system in which accessing conflicts do not require memory ports to access data words at different times.

It is another object of the present invention to provide multi-port memory apparatus that avoids the delay inherent in multi-port memory devices utilizing deterministic time-domain multiplexing.

A further object of the invention is to provide a multi-port memory system that eliminates non-deterministic delay, thereby accelerating memory operations and simplifying implementation of the multi-port memory device.

Other general and specific objects of the invention will in part be obvious and will in part appear hereinafter.

SUMMARY OF THE INVENTION

The foregoing objects are attained by the invention, one aspect of which provides multi-port methods and apparatus for storage and retrieval of digital data. The invention can be embodied in a Random Access Memory (RAM) device or a Read-Only Memory (ROM) device. The apparatus includes a memory element having an array of memory cells, each cell having fewer ports than are provided by the memory system. The memory cells are adapted for storing digital data words, each word being a set of bits or symbols. The memory array is partitioned into a plurality of bins for storing words, the individual bits of each word being distributed in a selected addressing sequence among a plurality of selected bins in the memory array, such that bin reading conflicts generate a number of errors less than or equal to a numerical error limit K, where K is less than the number of bits in a word.

The apparatus further contains an input element for receiving at least a first input signal representative of an externally generated memory address, and a second input signal representative of either a request to WRITE a data word into the memory array or a request to READ a data word stored in the memory array—such as, for example, in a ROM array.

The apparatus also includes a decoding unit in communication with the input element, for distributing, in response to a WRITE request, the bits of each input word into the selected memory bins in accordance with the selected sequence, and retrieving, in response to a READ request, the distributed bits of each word out of the memory array bins.

The decoding unit contains a bin addressing element, responsive to the selected addressing sequence, for converting the input signal representative of an externally generated memory address into a bin address that designates any of the bins in which at least one bit of a word is to be stored, or the bins from which at least one bit of a word is to be retrieved.

An error correcting unit coupled to the memory array can correct a number of errors in each retrieved data word, the maximum number of correctable errors being greater than or equal to K. The data words contain redundant information that can be used for error correction in case of conflict.

In one aspect of the invention, the bin addressing element includes Galois Field (GF) processor elements for executing GF arithmetic operations on each externally generated memory address to calculate each bin address. Alternatively, the bin addressing element can calculate bin addresses in accordance with other addressing schemes, as discussed hereinafter.

The invention will next be described in connection with certain illustrated embodiments; however, it should be clear to those skilled in the art that various modifications, additions and subtractions can be made without departing from the spirit or scope of the claims.

BRIEF DESCRIPTION OF THE DRAWINGS

For a fuller understanding of the nature and objects of the invention, reference should be made to the following detailed description and the accompanying drawings, in which.

DESCRIPTION OF ILLUSTRATED EMBODIMENTS

Figure 1:
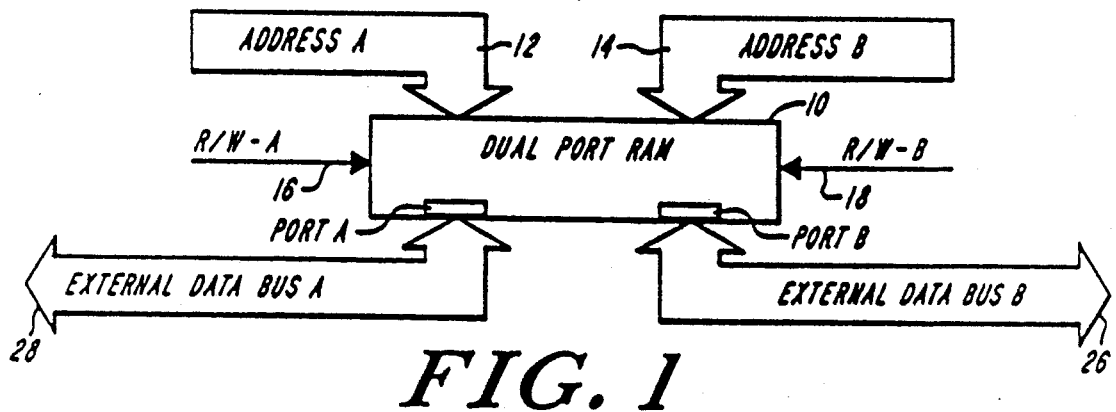
FIG. 1 is a block diagram of a dual-port RAM configured in accordance with the invention.

FIG. 1 depicts a dual-port RAM 10 constructed in accordance with the invention. As described in greater detail below, the RAM 10 provides selective storage and retrieval of digital data, stored in an array of memory locations, each memory location being addressable by a unique address. While the drawings depict a dual-port RAM, the invention can be practiced in RAM having two or more ports—i.e., a multi-port RAM. The invention can also be practiced in a multi-port Read-Only Memory (ROM).

The RAM 10 shown in FIG. 1 has two data ports, designated Port A and Port B. Separately grouped ADDRESS lines ADDRESS A and ADDRESS B (12, 14) and DATA lines (24, 26) carry signals representative of memory addresses and data, respectively. In the illustrated embodiment of the invention, the DATA wires 24 and 26 are bi-directional and are used in both READ and WRITE operations. READ/WRITE (R/W) signals, transmitted to RAM 10 on lines 16 and 18, are also provided to separately select whether each port is performing a READ or WRITE operation, as further described hereinafter.

Figure 2:
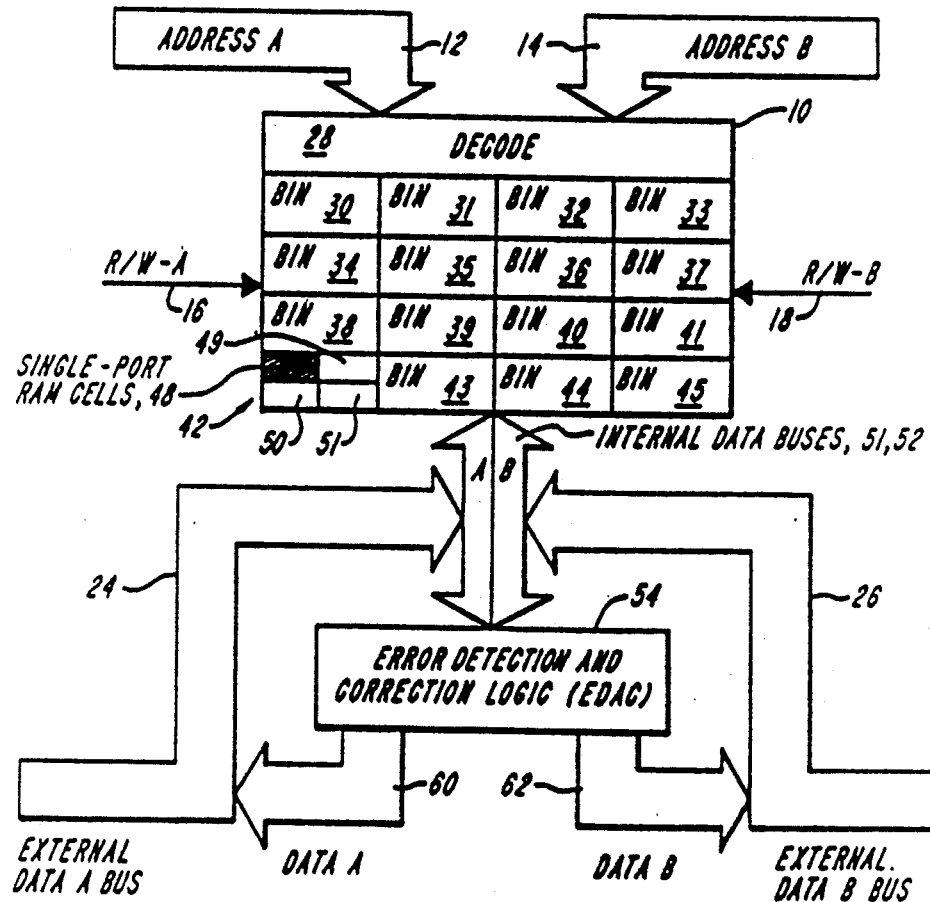
FIG. 2 is a schematic diagram showing detail of the dual-port RAM of FIG. 1.
Figure 3:
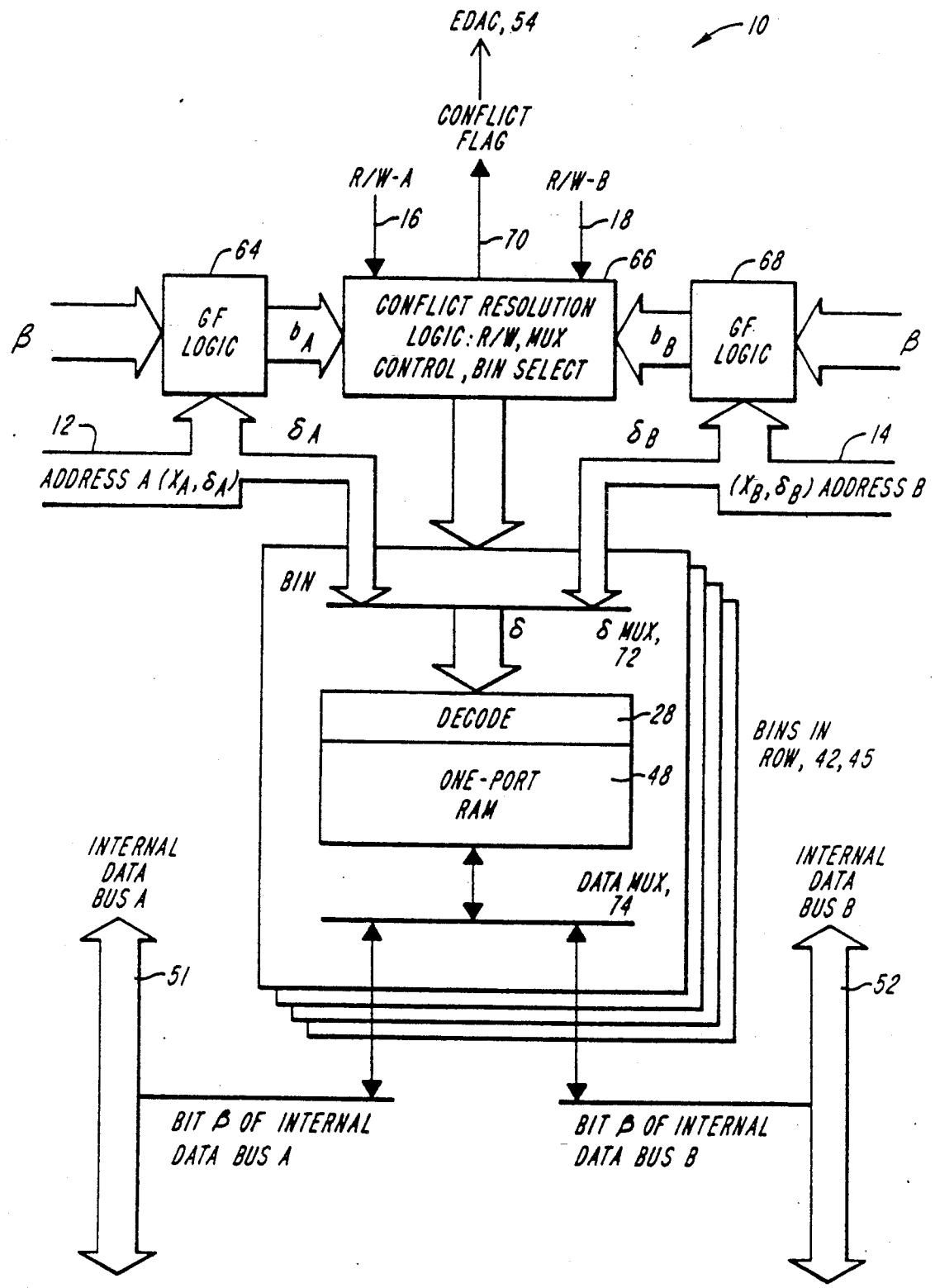
FIG. 3 depicts bin-selection logic utilized in accordance with the RAM of FIG. 1.
Figure 4:
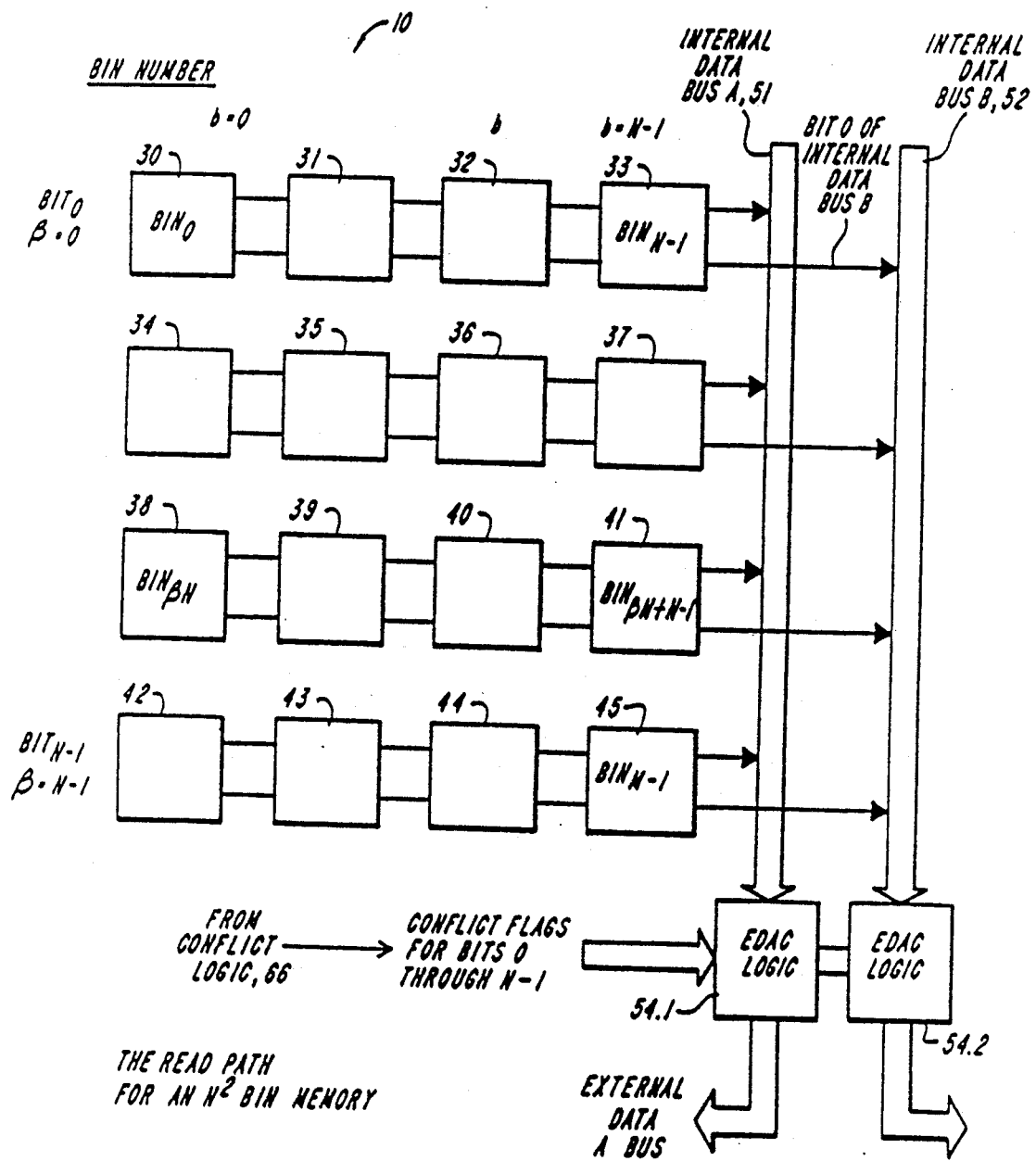
FIG. 4 shows detail of the READ data path of the embodiment of FIG. 1.

The structure and operation of RAM 10, depicted in greater detail in FIGS. 2-4, exploit three characteristics of data storage. First, data processing systems rarely store information in memory as single-bit objects, instead storing larger objects such as data words, collections of words, data packets, data structures, and database records. These larger objects are collectively referred to herein as "words."

Secondly, because such words are much larger than a single bit, only a small quantity of extra information—as little as one extra bit—need be stored to enable error correction by an external error correction device, as long as the number of bits containing errors is limited.

Thirdly, words can be stored in memory in such a way that the number of symbol errors caused by access conflicts is significantly less than the number of symbols in a word. It is therefore possible to provide an error correction device that corrects all of the errors introduced by conflicts, resulting in correct data on every access, assuming there are no other sources of error. An error correction module and a dual-port RAM structure in accordance with these principles is illustrated in FIG. 2.

FIG. 2 shows that the dual-port RAM 10 is partitioned into a set of M bins (referred to by reference numerals 30-45 in the illustrated example), having N rows and N columns. Each bin contains a plurality of single-port memory cells, exemplified by RAM cells 48-51 in bin 42.

A decoder circuit 28 decodes addresses presented to RAM 10 along address lines ADDRESS A and ADDRESS B (12, 14), utilizing Galois Field (GF) arithmetic operations, discussed in greater detail hereinafter.

The decoder 28 then operates in a known manner to activate internal RAM address lines, including word lines and column selectors, on the single-port RAM cell selected by the externally applied address for storing data. The data lines of each single-port RAM cell are gated onto internal data buses A and B (51, 52).

The internal data buses 51, 52 are coupled to error detection and correction EDAC unit 54. During READ operations, data signals from the RAM 10 via internal data buses 51, 52 are transmitted to, and corrected by, EDAC module 54, and the corrected data signals are transmitted along buses DATA A and DATA B (60, 62) to external data buses A and B (24, 26).

The illustrated EDAC unit 54 evaluates a parity bit retrieved with each data word to detect and correct errors. Each word entering RAM 10 on the external data buses 24, 26 preferably includes a parity bit. More particularly, each N-bit word stored in RAM 10 includes N−1 data bits and one parity bit, preferably indicative of the number of digital ONEs in the other N−1 bits of the word. In one practice of the invention, RAM 10 selects the value of the parity bit so that the number of ONEs in the N bit word is even. Thus, if the N−1 data bits contain an odd number of ONEs, the Nth bit—i.e., the parity bit—is set to digital ONE. If the N−1 bits of data contain an even number of ones, the Nth bit is a ZERO.

When the RAM system 10 detects a conflict involving a particular bit of the N-bit word (as described below in connection with FIG. 4) the EDAC unit 54 determines whether the number of ONEs in the retrieved word is odd or even. If the number is odd, the EDAC replaces the bit involved in the conflict with its complement. If the number is even, the bit is left unchanged.

Those skilled in the art will appreciate that if the data signals asserted to RAM 10 by the external data buses 24, 26 do not include a parity bit, then a parity bit can be computed and added to all words stored in the RAM as part of the WRITE cycle.

In the illustrated embodiment of the invention, data words to be stored in bins of RAM 10 are supplemented with redundant information, to enable post-retrieval error correction and reconstruction of the information. For example, 64 bits of information can be "expanded" by redundant information to 70 bits and stored in 70 binary memory cells of the memory array. During a READ operation, if two ports address bits in different bins, no conflicts occur. If two ports address bits in the same bin, a conflict arises. However, while collisions occurring in the narrow data paths may cause certain bits in the 70 memory locations to be destroyed as a result of conflicts, each original data word can nonetheless be reconstructed perfectly, provided that at least 64 bits of information are delivered to each port—i.e., so long as no more than six bits of information are lost.

An important feature of the invention, therefore, is bin-selecting logic that distributes individual bits of data words in memory bins according to a selected addressing sequence. The selected addressing sequence ensures that the number of bits lost through collisions is bounded, or, more particularly, that no two selected data words can collide in more than a limited number of bit positions. This upper limit on error permits the EDAC logic 54 (FIG. 2) to correct the limited number of bits that maybe erroneous, enabling accurate reconstruction of data words.

While the bin-selecting logic can utilize more than one such addressing sequence to provide the necessary distribution of individual bits in memory bins, the illustrated bin-selecting logic distributes individual bits according to a sequence based on finite field or Galois Field (GF) arithmetic.

Bin-selecting logic elements in accordance with the invention are depicted in FIG. 3. Each address word transmitted to RAM 10 by external address lines ADDRESS A and ADDRESS B (12, 14) is partitioned into two components, referred to as $\delta$ and x. The logical address of each word is denoted by the pair $(x,\delta)$. In one practice of the invention, $\delta$ and x each contain p bits, and each address is 2p bits wide. For each input address $(x,\delta)$ and each bit position $\beta$, the GF logic units 64, 68 compute a bin number $b_A$ for port A and $b_B$ for port B, where $$b = x + \beta * \delta \qquad \text{Eq. (1)}$$

The symbol "+" denotes addition operations, and the symbol "*" denotes multiplication operations, which are preferably executed as GF arithmetic operations.

Thus, given an input address $(x,\delta)$, in each row $\beta$, the bin number is b, where b is a function of $\beta$, x, and $\delta$, and the position of the bit in the bin is $\delta$. In particular, GF logic elements 64, 68 use the value of x to select a bin, and use the value of $\delta$ for two purposes: to select a bin number, and as the address of the bit in the selected bin.

This addressing sequence ensures that no two data words can collide in more than a limited number of bit positions. In particular, Eq. (1) defines a line where x is the intercept and $\delta$ is the slope. No two lines can intersect at more than one point $b,\beta$ (bin number and bit position) unless x and $\delta$ are the same—i.e., the two lines are the same. In the context of RAM 10, this means that no two addresses can correspond to the same bin b in more than one bit position $\beta$, unless they are the same address. The number of conflicts is thus limited. Additionally, if two lines intersect at one point—meaning, in the context of RAM 10, that there is a conflict in a bin b, then they must have different slopes $\delta$. Thus, $\delta$ can be used as the address of the bit within the bin.

In an embodiment of the invention utilizing Galois Field addressing, the operations of Eq. (1) are preferably executed in $GF(2^p)$. Those skilled in the art will recognize that this form of arithmetic requires no carries and can be executed at high speed by GF logic elements 64, 68. These logic elements can be, for example, hard-wired logic elements. Executing arithmetic operations in $GF(2^p)$, rather than in a conventional manner, yields bin numbers b between 0 and $2^p-1$.

During operation of the RAM 10 of FIG. 3, the following states can arise:
1. Ports A and B both simultaneously execute a READ operation and
   a. no conflict occurs, or
   b. conflict occurs;
2. Both ports execute a WRITE operation; or
3. One port executes a READ, and the other a WRITE.

When ports A and B simultaneously execute a READ request, two bins per bit position will be selected. The bin-addressing elements indicated in FIG. 3 calculate the numbers of the two bins ($b_A$ and $b_B$) to be addressed, and the output signals from these bins are gated onto the internal data buses A and B (51, 52). The GF logic elements 64, 68 transmit signals representative of the calculated bin numbers $b_A$ and $b_B$ to the conflict resolution element 66, which determines whether a conflict has occurred.

If $b_A$ is not equal to $b_B$, no conflict is indicated, and $\delta_A$ and $\delta_B$ are routed to their selected different bins.

If $b_A = b_B$ for a bit position $\beta = j$, that is, when two ports simultaneously address READ requests to a bin containing bits for the jth bit position, a conflict occurs. Conflict resolution logic unit 66 raises a conflict flag corresponding to the jth bit position, to signal that the jth bit position may contain an error. The conflict resolution unit 66 also selects either of the two addresses $\delta_A$ or $\delta_B$, and causes the output word from the selected one-port RAM cell 48 to be gated onto both internal data buses A and B (51, 52). It is because one of these outputs may be erroneous that conflict resolution unit 66 transmits its conflict flag to EDAC 54, indicating which bit position contains a potential error.

If both ports address the same word on a READ—i.e., a special case of the READ-READ condition described above—then both get the same correct result, and logic elements in element 66 can suppress the conflict flags in all bit positions. The conflict mechanism is disabled in this special case because the conflict logic will report a conflict in every row.

In the interest of simplicity, the illustrated embodiment does not support handling of conflicts arising from simultaneous WRITE requests. In this WRITE-WRITE case, there can be two errors for each word read, because errors can be introduced on both WRITING and READING. Thus, the simple parity scheme discussed above is insufficient. Moreover, while the illustrated conflict logic 66 reports READ errors to the EDAC units, the conflict logic does not report errors introduced by WRITE conflicts, because such conflicts may have occurred some time in the past.

Those skilled in the art will recognize, however, that the illustrated embodiment can be expanded to provide WRITE-WRITE conflict handling. In particular, during a WRITE, extra information can be stored in a given word to identify bits which potentially contain WRITE errors. When the word is subsequently read, the correction logic can use the conflict flags to determine which bits might contain an error arising from the READ, while using the extra information added to the word during the WRITE to determine which bits might contain an error from a previous WRITE. The EDAC logic can then correct both sources of error. This technique simplifies error detection by exploiting knowledge of the possible positions of potential errors.

Alternatively, the invention can be practiced with more redundant encoding of data words, to enable the EDAC units to detect and correct all possible errors induced by WRITE and READ conflicts, without the help of the conflict flags or the extra information specifically identifying which bits might be in error. For example, 64 bits of data might be stored with an extra 16 bits of redundancy, so that the EDAC unit can detect and correct double-bit errors with little or no assistance from the conflict flags. Detection and correction circuitry for correction of double-bit errors is known in the art.

When one port operation is a READ and the other a WRITE, the WRITE address is selected and the appropriate data signals from the internal data buses (51, 52) are stored without error. The READ occurs in the same manner as in the READ-READ case with conflicts, described above.

Those skilled in the art will recognize that conflict resolution signaling unit 66 can utilize conventional digital signal processing circuitry.

Referring again to FIG. 3, signals representative of $\delta_A$ and $\delta_B$ are routed to all bins. At each bin a $\delta$-multiplexor 72 selects which address, if any, is gated into the RAM in each bin. The $\delta$-multiplexors 72 are constructed in accordance with conventional signal multiplexing practice. Logic units 64, 68, which compute $b_A$ and $b_B$ as described above, control the $\delta$-multiplexors.

In particular, the multiplexing is configured so that bin $b_A$ receives address $\delta_A$ and has its data line connected to bit $\beta$ of the internal data bus A, and similarly for bin $b_B$. The data bit addressed by $\delta_A$ in bin $b_A$ is gated onto internal data bus A, and the data bit addressed by $\delta_B$ in bin $b_B$ is gated onto internal data bus B. These operations are directed by the data-multiplexors 74 attached to each bin and controlled by logic units 64, 68.

As a result of the GF addressing scheme implemented in the illustrated embodiment of the invention, if a simultaneous READ conflict occurs in a given row, then no other row will have a conflict. In that row, either $\delta_A$ or $\delta_B$ will be selected, and the data out of bin $b_A$ ($=b_B$) is gated onto bit $\beta$ of both internal data buses A and $\beta$.

In one practice of the invention, when the special case of external address $(x_A, \delta_A) = (x_B, \delta_B)$ occurs—that is, when both ports request the same data word and there is a "conflict" in every bit—this operation is executed for all bit positions $\beta$, notwithstanding that the GF addressing scheme limits conflicts to only a single bit position when the external addresses are different—i.e., in only one bit position can $b_A = b_B$.

Following retrieval of stored data by the READ operation, as described above, error-correction is provided by EDAC of FIG. 4. In particular, FIG. 4 shows the latter portion of the data path for READ operations in RAM 10. RAM 10 can be configured, as shown, so that all bins for a given bit position in a given word are in the same row. In the embodiment of FIG. 4, it is assumed that the number of bits in a word is equal to the number of bins corresponding to one bit position, so that the array of bins is square. Thus, if each word is N bits wide, then the total number (M) of bins in the array is given by the function $M = N^2$. The logic elements depicted in FIG. 3 correspond to one row in the RAM array of FIG. 4; and N single-port memory bins are connected with each of the N bit positions in the word, including the parity bit.

Referring to FIG. 4, internal data buses A and B (51, 52) collect bits from each of the rows $\beta = 0$ to $\beta = N - 1$ and transmit these bits to respective Error Detection and Correction (EDAC) logic blocks 54.1 and 54.2. In the embodiment depicted in FIG. 4, the EDAC logic blocks 54.1 and 54.2 also receive conflict flags from conflict logic 66 (FIG. 3) for the bits $b = 0$ to $b = N - 1$. As discussed above in connection with FIG. 3, when two ports simultaneously address a bin containing bits for the jth bit position ($\beta = j$) in a word ($b_A = b_B$ for $\beta = j$), conflict resolution logic unit 66 raises the jth conflict flag, to signal that the jth bit position may contain an error.

Additionally, as stated above, EDAC logic units 54.1, 54.2 can be constructed from known parity-checking circuits, and can detect and correct errors based on the conflict flags and the parity of each data word. Each word retrieved from the memory array of RAM 10 by a READ operation contains N bits, including $N - 1$ bits of data and one parity bit indicative of the number of digital ONEs in the other N−1 bits of the word. When RAM 10 assigns a parity bit to each word, it selects the value of the parity bit so that the number of ONEs in the N bit word is even. If the conflict resolution logic unit 66 (FIG. 3) signals a conflict in a bin corresponding to the jth bit position in the word, the EDAC circuitry tests the N-bit word to see if the number of ONEs is odd or even. If the number is odd, then the jth bit is replaced with its complement. If the number is even, the jth bit is left unchanged. This error correction technique functions properly even if the jth bit is the parity bit.

The EDAC circuitry for executing these operations is connected to the Internal Data Buses A and B, as shown in FIG. 4. If one port executes a READ and the other a WRITE, only the EDAC logic corresponding to the READ port is activated.

The GF addressing scheme implemented by the invention ensures the conflicts, if they occur, introduce no more than one error per word—a conflict, if it occurs, will occur in only one row of the memory array. Therefore, since the parity-checking EDAC units depicted in FIG. 4 can correct any one-bit error, all output words will be correct.

It will thus be seen that the invention efficiently attains the objects set forth above, among those made apparent from the preceding description. A RAM or ROM device constructed in accord with the invention provides substantially higher performance than that of narrow-path memory, while requiring significantly less wiring and area than that necessitated by conventional multi-port memory devices having wide data paths.

It will be understood that changes may be made in the above construction and in the foregoing sequences of operation without departing from the scope of the invention. Thus, for example, bin address calculations may be executed using schemes other than Galois Field arithmetic. Additionally, while RAM embodiments of the invention are depicted in the accompanying drawings, the invention can also be practiced in ROM devices. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. A memory apparatus for storing and providing retrieval of multiple-bit digital data words, the apparatus comprising memory array means for selectively storing the data words, said memory array means being partitioned into a set of bins for storing the words, each said bin including an array of memory cells capable of storing at least one bit, each memory cell having a number of memory cell ports, external data port means, in communication with the memory array means, for receiving at least one of (i) words to be stored in the memory array means or (ii) words to be retrieved from the memory array means, said external data port means having a number of external ports, the number of external ports being greater than the number of memory cell ports of a single memory cell, control means, in communication with said memory array means, for receiving first external signals representative of requests, asserted by an external port, to execute at least one of (i) storing a word in the memory array means or (ii) retrieving a word stored in the memory array means, address decoding means, in communication with said memory array means and said control means, for receiving second external signals representative of external memory address values designating words to be either stored in or retrieved from said memory array means, and converting said second external signals into internal bin addresses designating a plurality of selected bins in which bits of a word are to be either stored or retrieved, said address decoding means including bin address calculation means, responsive to bit-position values of the bits of each word to be either stored or retrieved, for calculating said bin addresses in accordance with a predetermined bit distribution pattern, to distribute the bits into selected bins, such that requests to retrieve a given data word result in a limited number of bin reading conflicts, the number of bin reading conflicts associated with each word being less than the number of bits in each word, and error correction means, in communication with the memory array means, for receiving words retrieved from the memory array means and correcting errors in each word resulting from bin reading conflicts, to provide substantially error-free output words.

2. Apparatus according to claim 1, wherein the number of external ports is two, and the number of memory cell ports in each memory cell is one.

3. Apparatus according to claim 1, further comprising data channel means, connected to the memory array means, for connecting the memory array means to a remote digital processor.

4. Apparatus according to claim 1, wherein said control means includes priority control means for assigning a priority value to each request to either (i) store a word or (ii) retrieve a word, wherein a request to store a word is assigned a higher priority value than a request to retrieve a word, so that fewer conflict errors arise from execution of requests to store data words than from execution of requests to retrieve data words.

5. Apparatus according to claim 1, further comprising conflict detection means, in communication with said memory array means and with said error correction means, for detecting conflicts, in response to said requests asserted by said external ports, and for transmitting to said error correction means a conflict indicator signal indicating which bits in a given word are involved in a detected conflict.

6. Apparatus according to claim 5, further comprising parity bit means for storing in said memory array means, in association with each word, at least one parity bit having a selected value, and wherein said error correction means contains parity checking means, responsive to said conflict indicator signal, for testing the value of said at least one parity bit in each word having bits involved in a detected conflict, and for correcting the value of each bit involved in a detected conflict in response to a parity bit value other than the selected parity bit value.

7. Apparatus according to claim 1, wherein said error correction means includes means for correcting errors arising from sources other than conflicts.

8. Apparatus according to claim 1, wherein said address decoding means includes simultaneous-read means for providing accurate retrieval of a given word stored in said memory array means to a plurality of external ports simultaneously asserting a request to retrieve the same given word, said simultaneous-read means comprising address equality testing means, responsive to said external memory address values, for determining whether more than one external port is simultaneously asserting a request to retrieve the same given word, and for generating an address-equal signal when more than one external port is simultaneously asserting a request to retrieve the same given word, access enable means, for enabling one external port to retrieve the given word, and retrieved-word distribution means, responsive to the address-equal signal, for distributing the retrieved-word to all ports asserting a simultaneous request to retrieve a given word.

9. Apparatus according to claim 1, wherein said memory array means is structured in a pipelined configuration.

10. Apparatus according to claim 1, wherein said address decoding means includes means for processing multiple simultaneous requests to store words in a plurality of bins.

11. Apparatus according to claim 1, further comprising at least one arithmetic logic means, in communication with said memory array means, for executing selected arithmetic operations on bits stored in said memory array means.

* * * * *